(12) United States Patent
Tellkamp

(10) Patent No.: US 7,256,117 B2
(45) Date of Patent: Aug. 14, 2007

(54) METHOD FOR EVALUATING AND MODIFYING SOLDER ATTACH DESIGN FOR INTEGRATED CIRCUIT PACKAGING ASSEMBLY

(75) Inventor: John Paul Tellkamp, Denison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/614,167

(22) Filed: Dec. 21, 2006

(65) Prior Publication Data
US 2007/0092999 A1   Apr. 26, 2007

Related U.S. Application Data

(62) Division of application No. 10/896,808, filed on Jul. 22, 2004, now Pat. No. 7,166,481.

(51) Int. Cl.
*H01L 21/44* (2006.01)
(52) U.S. Cl. .................. 438/612; 438/615; 438/15; 257/779; 257/780; 714/4; 714/6
(58) Field of Classification Search .................. 438/15, 438/612, 613; 716/4, 6
See application file for complete search history.

(56) References Cited

U.S. PATENT DOCUMENTS 5,956,606 A * 9/1999 Burnette ..................... 438/615
5,959,356 A   9/1999 Oh

* cited by examiner

*Primary Examiner*—Andy Huynh
*Assistant Examiner*—Thinh T Nguyen
(74) *Attorney, Agent, or Firm*—Yingsheng Tung; Wade James Brady, III; Frederick J. Telecky, Jr.

(57) ABSTRACT

A method of reducing a likelihood that a die pad will be delaminated from a die in an integrated circuit die package for a structure design during an attachment of a heat sink member to the die pad using solder, is provided. A sample structure of the structure design is evaluated to determine whether a volume of last solidification for the solder is centrally located with respect to the die pad and is located at or near an interface of the solder and the die pad. If the last solidification volume is centrally located and is located at or near the interface of the solder and the die pad, and if the die pad is delaminated from the die, the structure design is modified so that less metal of the heat sink member is centrally located than before the modifying.

7 Claims, 8 Drawing Sheets

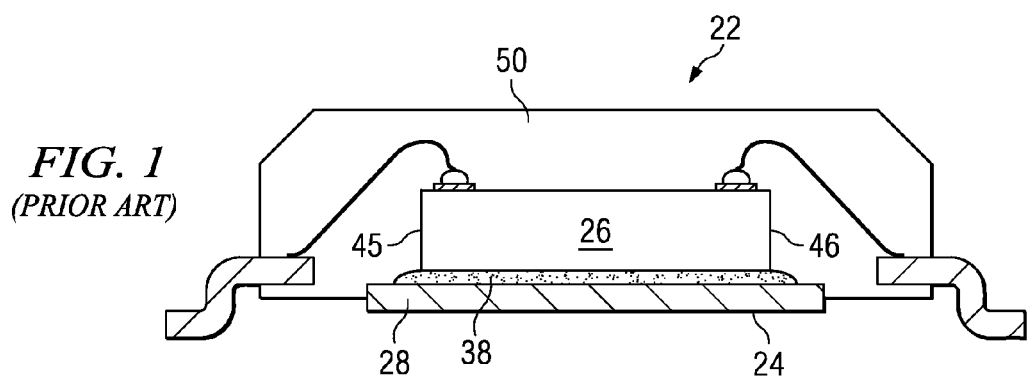
FIG. 1
*(PRIOR ART)*
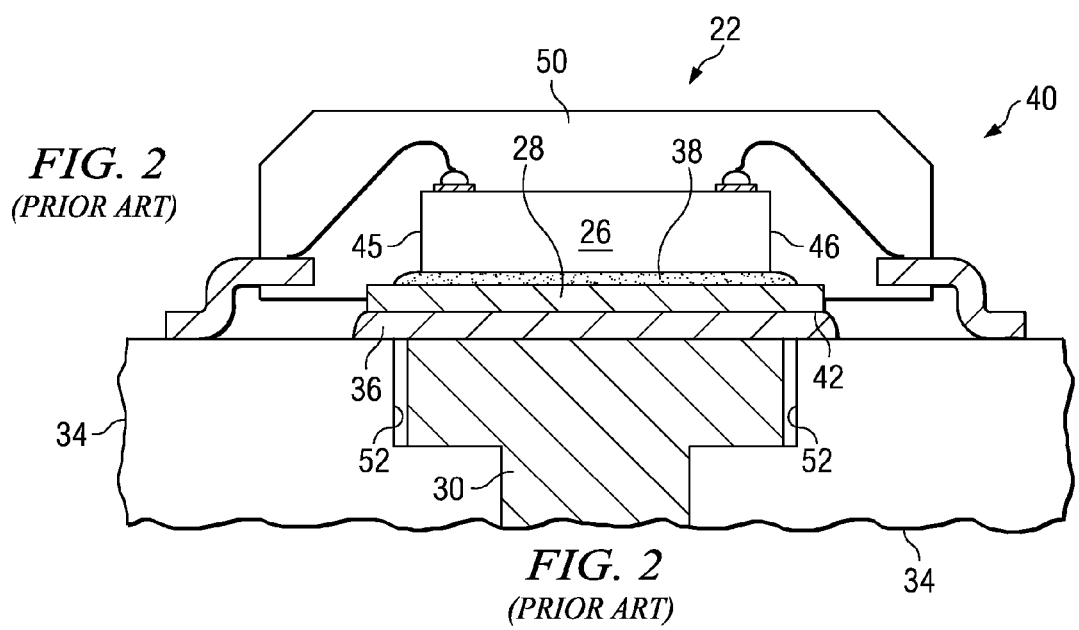
FIG. 2
*(PRIOR ART)*
FIG. 2
*(PRIOR ART)*
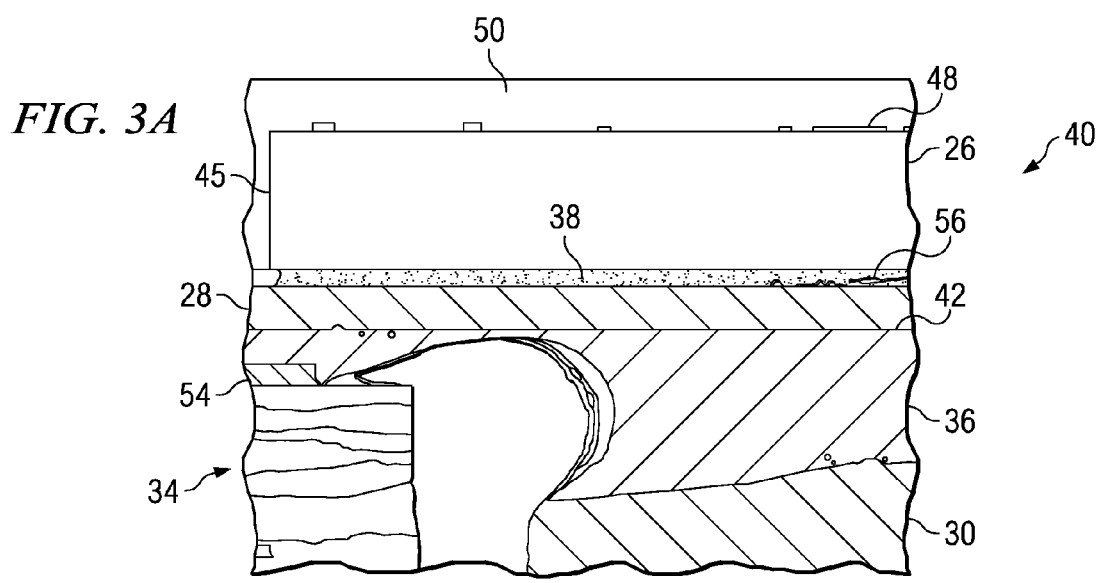
FIG. 3A

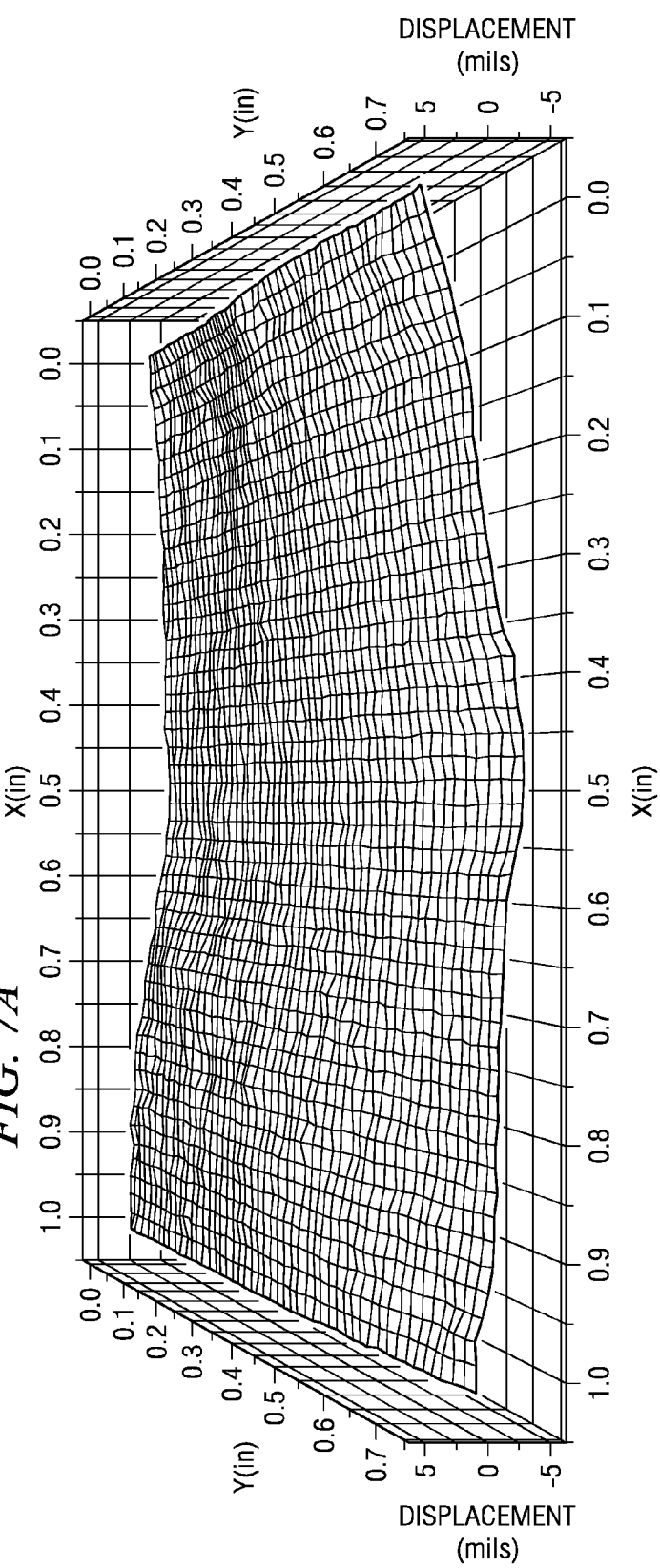
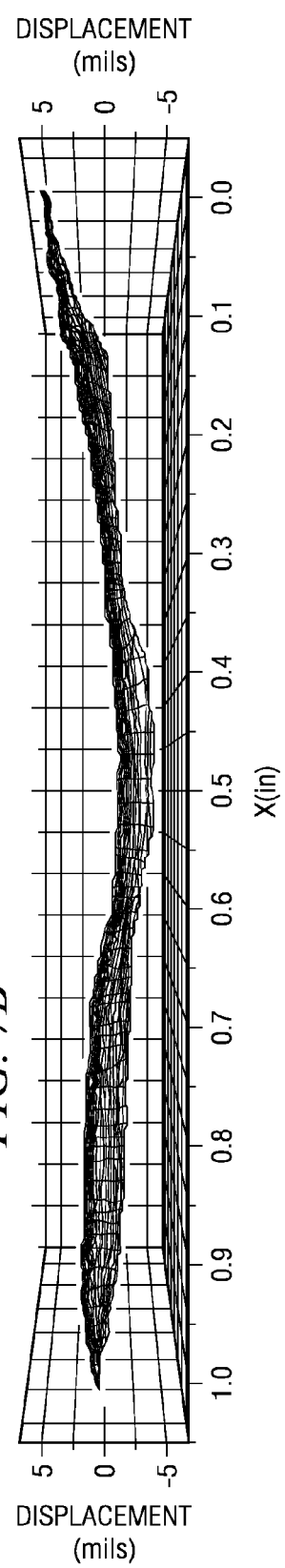
FIG. 7A
FIG. 7B

METHOD FOR EVALUATING AND MODIFYING SOLDER ATTACH DESIGN FOR INTEGRATED CIRCUIT PACKAGING ASSEMBLY

This is a divisional application of application Ser. No. 10/896,808 filed Jul. 22, 2004, now U.S. Pat. No. 7,166,481 the contents of which are herein incorporated by reference in its entirety.

TECHNICAL FIELD

The present invention relates generally to integrated circuit packaging and assembly, and testing thereof. In one aspect it relates more particularly to evaluating and modifying a solder attach structure design for an integrated circuit packaging assembly.

BACKGROUND

Heat dissipation from an integrated circuit (IC) chip or die during operation is typically an important issue, especially as the density of IC devices on a die continues to increase. Also, many devices now have combinations of high-power transistors and low-power transistors formed on a same die. Such high-power transistors tend to produce more heat than low-power transistors. Further, more system-on-chip configurations are being used. Thus, there are often a wide variety of IC devices on a same die. Some of the IC devices can handle and/or put out much more heat than nearby or neighboring devices on the same die. Hence, the reliability and effectiveness of heat dissipation for a packaged IC die may greatly affect the reliability and/or performance of an IC chip during operation.

Many die packages 22 have an exposed die pad surface 24, as shown in FIG. 1 for example. Typically a die 26 is attached to or bonded to a die pad 28 to improve heat transfer from the die 26 via the die pad 28. An exposed die pad 28 is often soldered to a heat sink member 30, as shown in FIG. 2 for example, or other metal components on a printed circuit board (PCB) 34 to provide a primary heat transfer path from the die 26 to the heat sink 30 via the die pad 28. The heat sink 30 in FIG. 2 is a metal rivet that extends through the PCB 34. Many die pads 28 of die packages 22 are thin to help reduce package size (e.g., package thickness). As a result, many die pads 28 are flexible and easily deformed (like a diaphragm). In such cases, it has been found that the forces exerted on a die pad 28 by solidifying solder 36 may be great enough to cause delamination between the die pad 28 and the die 26 where the die 26 is supposed to be attached to the die pad 28. Such delamination may greatly reduce the heat transfer efficiency and hinder the thermal path for cooling the die 26 via the die pad 28. It would be preferred to reduce the probability that a die pad 28 may be delaminated from a die 26 or deformed by a solder attachment procedure due to solder solidification forces.

SUMMARY OF THE INVENTION

The problems and needs outlined above may be addressed by embodiments of the present invention. In accordance with one aspect of the present invention, a method of reducing a likelihood that a die pad will be delaminated from a die in an integrated circuit die package for a structure design during an attachment of a heat sink member to the die pad using solder, is provided. This method assumes that the heat sink member includes metal. A sample structure of the structure design is evaluated to determine whether a volume of last solidification for the solder is centrally located with respect to the die pad and is located at or near an interface of the solder and the die pad. If the last solidification volume is centrally located and is located at or near the interface of the solder and the die pad, and if the die pad is delaminated from the die, the structure design is modified so that less metal of the heat sink member is centrally located than before the modifying.

In accordance with another aspect of the present invention, a method of reducing a likelihood that a die pad will be delaminated from a die in an integrated circuit die package for a structure design during an attachment of a heat sink member to the die pad using solder, is provided. A sample structure of the structure design is evaluated to determine whether a volume of last solidification for the solder is at or near an interface of the solder and the die pad and is centrally located with respect to the die pad. If the last solidification volume is at or near the interface of the solder and the die pad, the structure design is modified so that the last solidification volume is located farther from the interface of the solder and the die pad than before the modifying and/or is located farther from a central location of the die pad in a direction along a plane of the die pad than before the modifying.

In accordance with yet another aspect of the present invention, a method of reducing a likelihood that a die pad will be delaminated from a die in an integrated circuit die package during an attachment of at least one heat sink member to the die pad using solder, is provided. A structure having a minimum solder thickness of greater than about 4 mils between the die pad and the at least one heat sink member is evaluated to determine whether a volume of last solidification for the solder is at or near an interface of the solder and the die pad. If the last solidification volume is at or near the interface of the solder and the die pad, the design of the at least one heat sink member is modified so that the last solidification volume will be shift farther away from the interface of the solder and the die pad than before the modifying.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which:

FIG. 1 is a cross-section view of a typical die package with an exposed die pad;

FIG. 2 is a cross-section view showing the die package of FIG. 1 attached to a heat sink member with solder and attached to a printed circuit board;

FIGS. 3A-3C and 4 show detailed cross-section views of two illustrative examples under evaluation;

FIG. 7 is surface map of a bowed die pad from a Moire experiment;

DETAILED DESCRIPTION OF ILLUSTRATIVE EMBODIMENTS

Figure 3B:
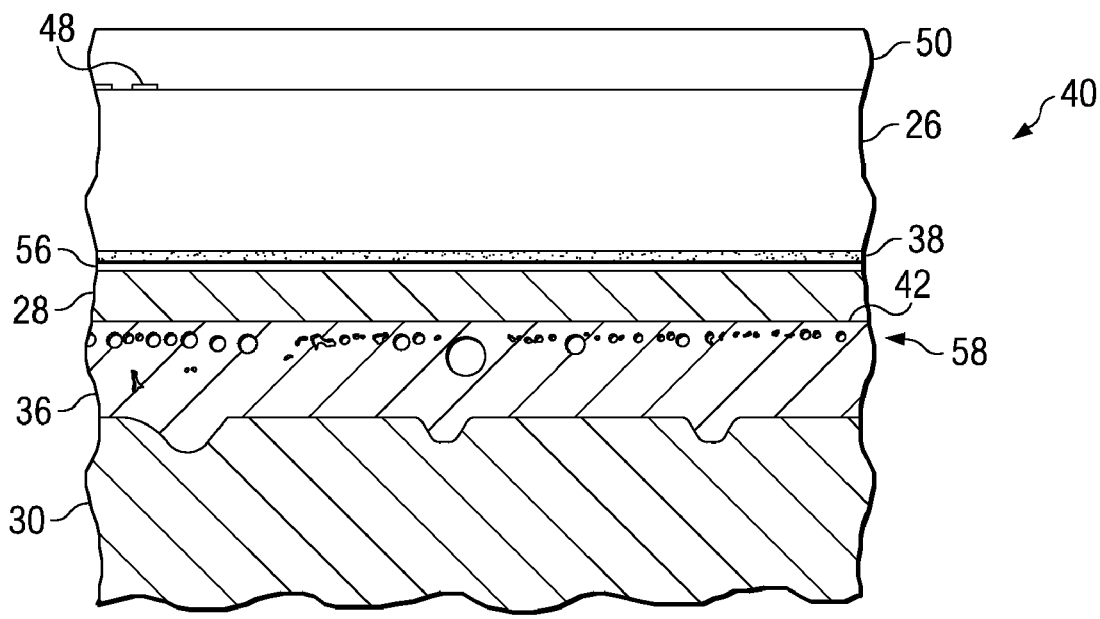

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

FIG. 1 is a cross-section view of a typical die package 22 with an exposed die pad 28. The die 26 is attached to the die pad 28 with a die mount compound 38 (e.g., adhesive) to provide efficient heat transfer from the die 26 out of the package 22 via the die pad 28. FIG. 2 is a cross-section view showing the die package 22 of FIG. 1 attached to a heat sink member 30 with solder 36 and attached to a PCB 34.

Generally, an embodiment of the present invention provides a method of reducing the likelihood that a die pad 28 will be delaminated from a die 26 during an attachment of a heat sink member 30 to the die pad 28 using solder 36. In one embodiment, this method includes a step of evaluating a structure 40 to determine whether a volume of last solidification for the solder 36 attaching the die pad 28 to the heat sink member 30 is at or near an interface 42 of the solder 36 and the die pad 28. An example of such evaluation will be described in more detail below. This method also includes a step of modifying the design of the structure 40 or the heat sink member 30 so that the last solidification volume for the solder 36 will be shifted farther away (vertically) from the die pad-solder interface 42 and/or farther (along PCB plane) from a central region of the die pad 28. Illustrative examples of modifying heat sink member designs are shown and discussed below.

Figure 3C:
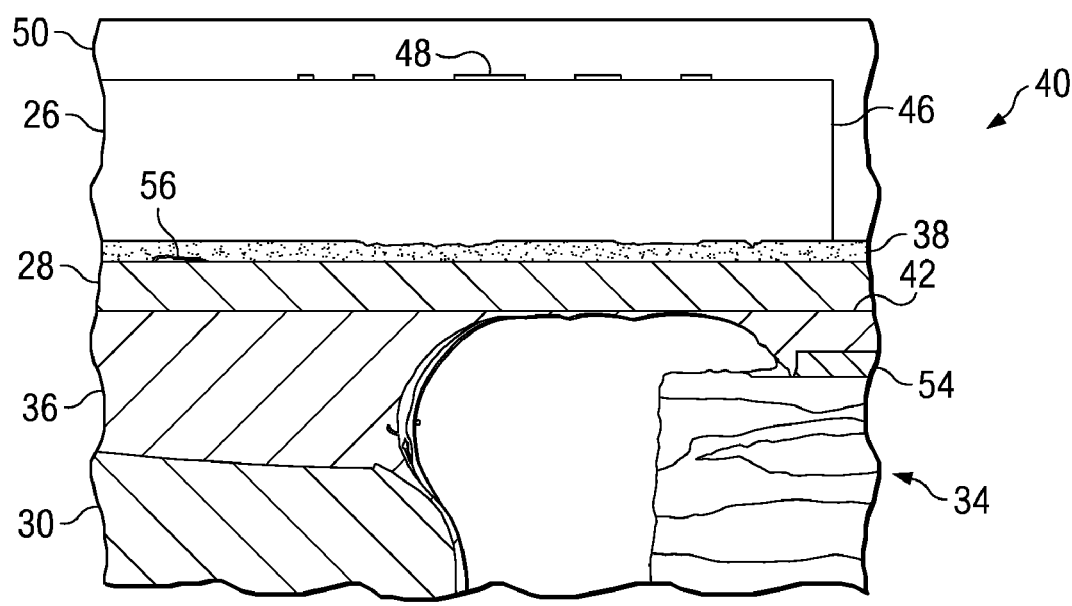
Figure 4:
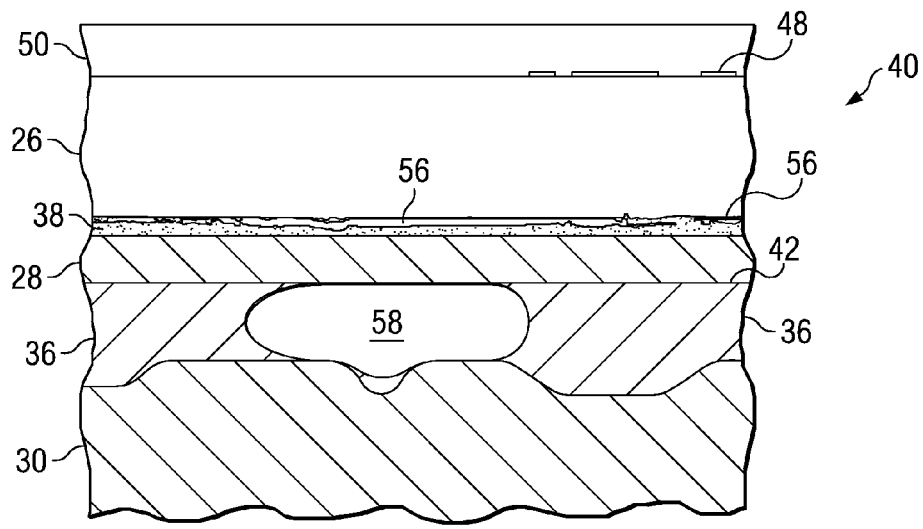

Evaluations of production structures 40 having essentially the same design shown in FIG. 2 were performed to investigate the cause of the die pad 28 becoming delaminated from the die 26. FIGS. 3A-3C and 4 show detailed cross-section views of two illustrative examples. FIGS. 3A-3C show a same sample of a structure 40 in three views. FIG. 3A shows a portion of the structure 40 at a left end 45 of the die 26, FIG. 3B shows a central portion of the structure 40, and FIG. 3C shows a portion of the structure 40 at a right end 46 of the die 26 (along the die pad plane). FIG. 4 shows a central portion of the same rivet structure 40 for another sample.

Briefly, the parts of the structure 40 shown in FIGS. 3A-4 will be described to provide a context for the discussion of these figures. Reference also may be made to FIG. 2 to understand the context of FIGS. 3A-4. A die 26, having integrated circuit devices 48 formed thereon, is attached to a die pad 28 by a die mount compound 38 (e.g., silver filled adhesive) to provide an intended heat transfer path between the die 26 and the die pad 28. The die 26 is covered by package mold compound 50 (e.g., plastic) to protect the die 26. A left end 45 of the die 26 is shown in FIG. 3A. A right end 46 of the die 26 is shown in FIG. 3C. The PCB 34 is shown in FIGS. 3A and 3C. The heat sink rivet 30 shown in FIGS. 3A-3C is extending through a hole 52 in the PCB 34 (refer also to FIG. 2 for context). In FIGS. 3A and 3C, copper traces 54 are shown on the top surface of the PCB 34, to which the solder is also attached. The solder 36 is located between the heat sink rivet 30 and the die pad 28. FIG. 4 is the same view as FIG. 3B, but for a different sample of the same structure design.

As shown in FIG. 3B, a void 56 is formed between the die pad 28 and the die 26 due to delamination. A close study of this sample revealed that the die pad 28 was pulled away from the die 26 and bowed downward toward the heat sink member 30 at the central portion (see FIG. 3B). A study of this sample also revealed air pockets (bubbles) 58 at the interface 42 of the solder 36 and the die pad 28 in the central portion (see FIG. 3B). The air pockets 58 shown in FIG. 3B indicate that this region 58 is the last solidification volume for the solder 36 during the cooling. FIG. 4 shows one large air pocket region 58 at a central portion of the structure 40. In FIG. 4, a void 56 is also formed between the die pad 28 and the die 26 due to delamination. FIGS. 3A and 3B reveal end portions of the void 56 shown in FIG. 3B.

Referring to FIG. 3B, the solder thickness in this sample structure 40 was about 7.4 mils at the central portion of the structure 40 and the void 56 had a thickness of about 1.3 mils at the central portion. In FIGS. 3A and 3C, the solder thickness at the PCB 34 is about 3.7 mils and the solder thickness at the edges of the rivet 30 is about 13.4 mils. In FIG. 4, the solder thickness is about 7.9 mils and the void 56 has a thickness of about 0.5 mils at the central portion of the structure 40.

There are a number of reasons that contribute to the delamination problem. During the heating of the structure 40 to reflow the solder 36 (while attaching the die package 22 to the heat sink member 30 and the PCB 34), the die mount compound 38 becomes softer and its adhesion strength is decreased. This allows the die pad 28 to be more easily bowed like a diaphragm when not sufficiently supported (e.g., supported by the die mount compound 38). Thus, it does not take much downward pressure on the die pad 28 to create a delamination void 56 between the die 26 and the die pad 28 during the reflow process. Also, the heat sink rivet 30 has a much greater mass than the die pad 28. The greater mass of the heat sink rivet 30 causes it to cool much slower than the die pad 28. The heat sink rivet 30 is also typically in contact with or attached to an even larger aluminum plate or fin (not shown). Furthermore, the heat sink rivet 30 of the structure design shown in FIGS. 2-4 is made from solid metal (as opposed to being hollow). As a result, the heat sink rivet 30 tends to cool from the outside toward its center. Another point to note is that the heat sink rivet 30 of this design is mechanically attached to the PCB 34 and its position relative to the top surface of the PCB 34 is often inconsistent during production. As shown in FIGS. 3A-3C, the top of the heat sink rivet 30 is not level with the top of the PCB 34 in this sample. This causes the solder 36 to be thicker at the heat sink rivet 30 than at the PCB 34. It is preferred to have a minimum solder thickness between the die pad 28 and the heat sink rivet 30 of about 4 mils or less. However, as shown in FIGS. 3B and 4, this minimum solder thickness is sometimes much greater than 4 mils (e.g., 7.4 mils in FIG. 3B, 7.9 mils in FIG. 4). As the solder 36 cools (from liquid phase to solid phase), its volume decreases by about 4% (for typical solder). Because the heat sink rivet 30 cools from the outside inward, a volume of last solidification for the solder tends to get trapped and concentrated in the central portion. The shrinkage of the cooling solder 36 at this last solidification volume 58, which is trapped between the already solidified solder (around the outside), the die pad 28, and the heat sink rivet 30, is then concentrated at the central portion. This trapped solder shrinkage causes a negative or downward suction pressure on the die pad 28, which pulls the central portion of the die pad 28 away from the die 26. These factors and conditions contribute to causing the die pad 28 to be delaminated from the die 26 during assembly. Thus, by eliminating or taking into account these factors, the likelihood that a die pad 28 will be delaminated from a die 26 during assembly may be reduced or even significantly reduced. This may be done by modifying the design of the heat sink member 30, for example, as described further below.

Figure 5:
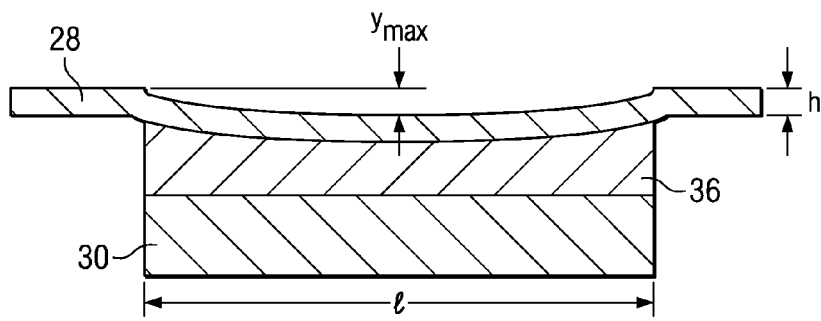
FIG. 5 is simplified schematic modeling the negative pressure exerted on the die pad due to solder shrinkage.

FIG. 5 is simplified schematic modeling the negative pressure exerted on the die pad 28 due to solder shrinkage during cooling at a trapped central portion of the structure 40. In FIG. 5, a die pad 28, solder 36, and a heat sink member 30 are shown. Using this structure model of FIG. 5, bending moment beam and displacement equations may be used to estimate the pressure required to cause delamination. The following basic equations may be used:

$Y_{max} = 5Wl^4/384EI$, $I = bh^3/12$, $\sigma = Mc/I$, and $M = Wl^2/8$, where $Y_{max}$ is the maximum allowable deflection (see FIG. 5) without causing delamination, l is the length of the trapped liquid solder 36 (see FIG. 5), W is an equally distributed pressure from the solder 36 over the length l, E is the Young's modulus for the die pad material (e.g., in pounds/inch$^2$), I is the moment of inertia of the die pad beam cross-section (e.g., in inches$^4$), b is the depth (Z axis) of the beam cross-section (e.g., in inches), h is the thickness of the die pad 28 (see FIG. 5), $\sigma$ is the stress in the leadframe material at the distance c (e.g., in pounds/inch$^2$) on the surface of the leadframe, M is moment about the ends of the die pad length l, and c is the maximum distance from the neutral axis consisting of half of the leadframe thickness (e.g., in inches).

A calculation using the model of FIG. 5 and these equations in one calculation shows that a pressure W of about 1.92 psi will likely deflect the die pad enough to cause delamination, i.e., based upon the following assumptions: $Y_{max}$ is about 0.001 inch (about 1 mil), length l is about 0.287 inch, h is about 0.005 inch, the die pad is made from CDA-194 leadframe alloy, E is $17 \times 10^6$ psi, and the yield stress of the leadframe material is about $70 \times 10^3$ psi. In another calculation, a pressure W of about 10.6 psi will likely deflect the die pad by about 0.0013 inch, while using the same assumptions as the prior calculation, except that the length l is shortened to be 0.200 inch. These are relatively low stress levels. These calculations reveal that the solder shrinkage may be a valid mechanism for causing delamination.

It is also noted that the material stress on the leadframe typically will be about 13 k psi, which is about 19% of the yield stress for the leadframe material. This is the stress that is exerted on the leadframe material, resulting from liquid solder solidifying. The liquid solder will transfer the force of the shrinking solder to the leadframe (like a negative pressure). Because the leadframe material has not been stressed beyond the yield point, a void 56 between the die 26 and the die pad 28 in an unsoldered package 22 (removed from the PCB 34 and heat sink rivet 30) will likely be closed up by this material stress, which may make detection of such voids difficult.

Figure 6:
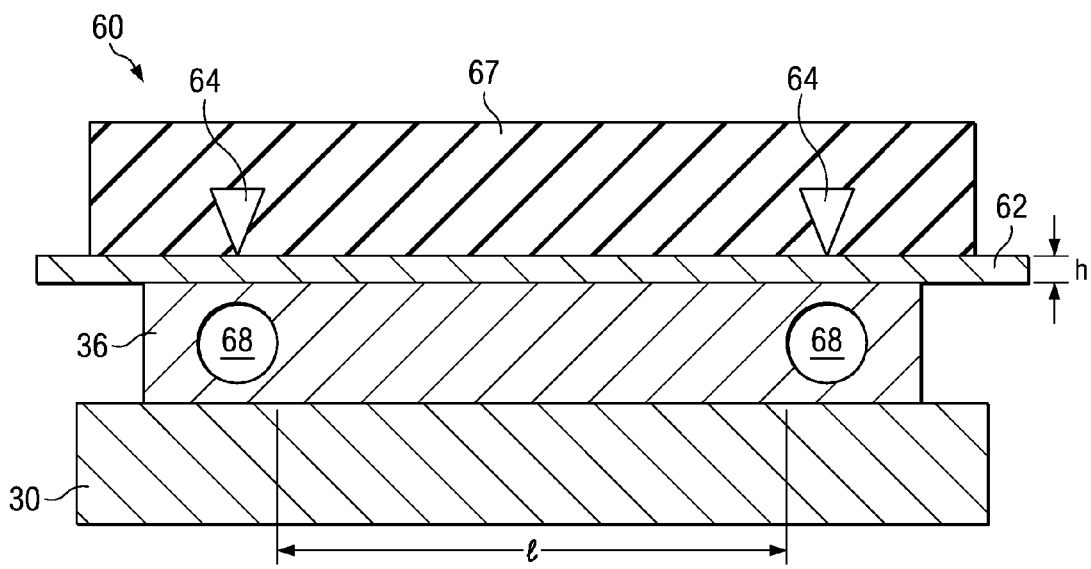
FIG. 6 shows a cross-section schematic of the test apparatus.

A test apparatus 60 (see FIG. 6) was built to trap the volume of last solidification for solidifying solder 36 against a die pad blank 62 at a central location and to measure the curvature of the die pad blank 62 from the negative pressure of the solidifying solder 36. Standard beam equations (as discussed above regarding FIG. 5) were used to estimate the pressure needed to cause the curvature under the specific test arrangement. FIG. 6 shows a cross-section schematic of the test apparatus 60. In this test apparatus 60, Teflon hold downs 64 define an initial height. A blank sheet 62 of leadframe material (with a thickness h of about 0.10 inch) has an insulation layer 67 above it. Below the die pad blank 62 are two pieces of metal tubing 68 (about 0.196 inch in diameter) separated by a length l of about 0.487 inch (see FIG. 6). These metal tubes 68 confine the solder 36 and promote solidification from the sides toward the center. A 63/37 solder was used for the experiments. An aluminum hot plate 70 was used to simulate the heated heat sink member cooling.

A Moire experiment provided a surface map of the resulting die pad blank 62, as shown in FIG. 7, which shows the actual surface curvature from an experiment using the test apparatus 60 of FIG. 6. In this experiment, the surface curvature of the die pad blank 62 spanning about 0.5 inch had a maximum bow of about 3.4 mils (see FIG. 7). Inputting these figures into the beam moment equations yields a stress at the interface 42 of the solder 36 and the die pad blank 62 of about 9277 psi.

Figure 8A:
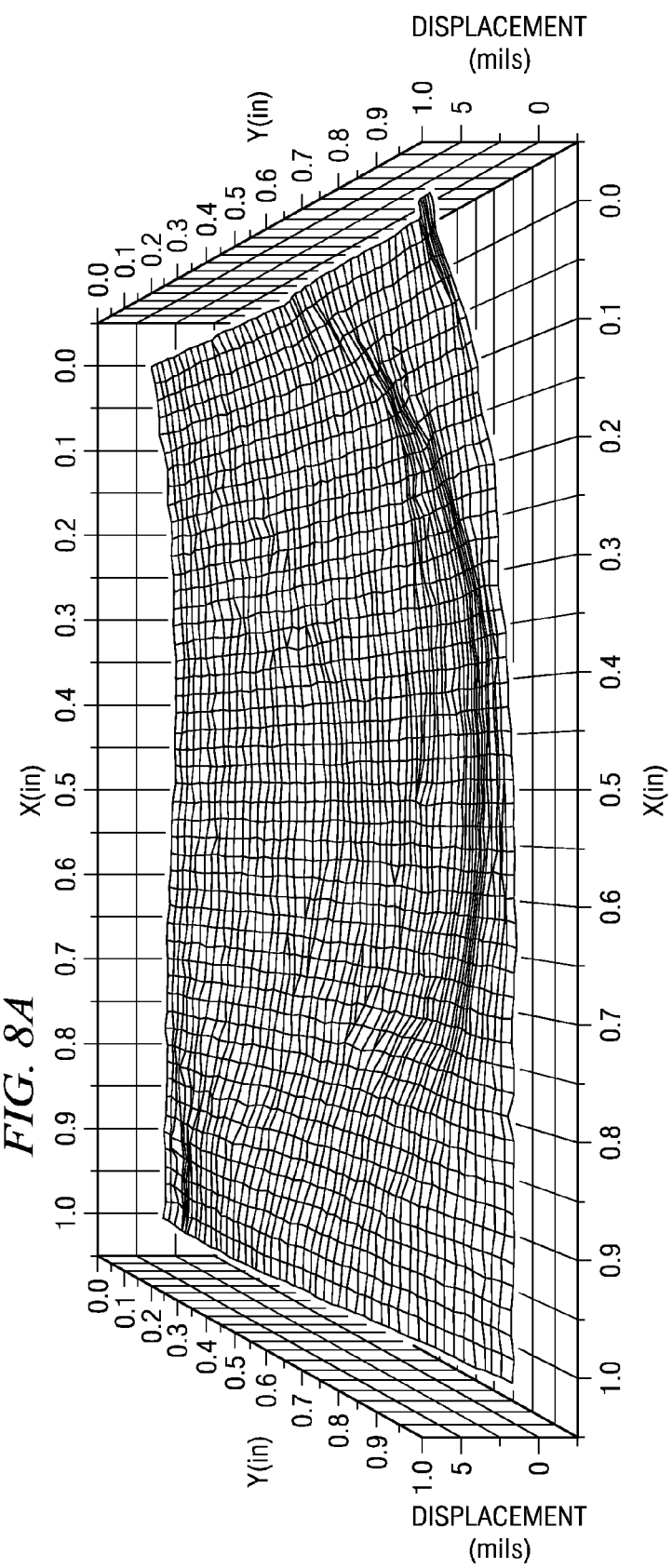
FIG. 8 is surface map of a bowed die pad from another Moire experiment.
Figure 8B:
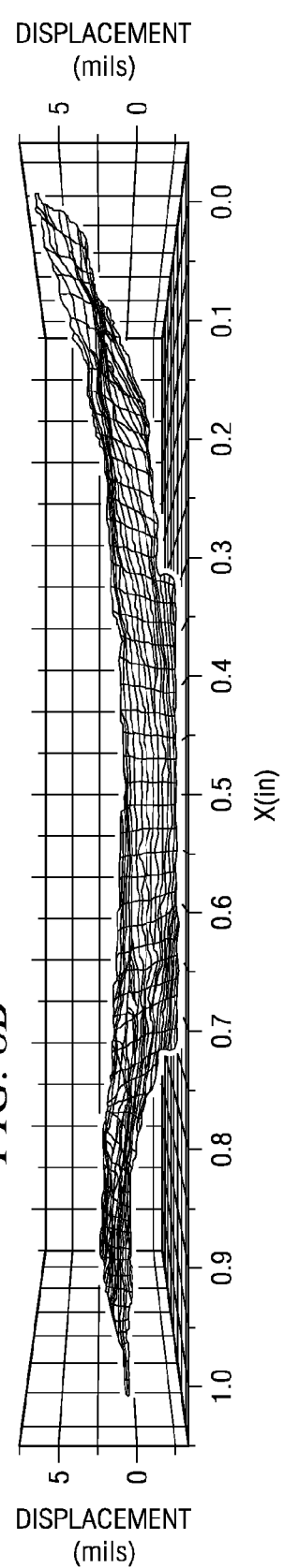

The results of another experiment using a larger die pad blank (length l of about one inch) are shown in FIG. 8. In this Moire experiment, a test apparatus 60 like that of FIG. 6 was used, but with a circular shaped (from a top view) support tube 68. A bow of about 4.16 mils with a diameter of about 0.875 inch was measured, as illustrated in FIG. 8. Thus, these experiments confirmed that negative pressure generated by trapped solidifying solder 36 at or near the solder/die pad interface 42 may be great enough to cause a delamination void 56 between the die 26 and die pad 28 of a die package 22.

In a method of the present invention for reducing the likelihood that a die pad 28 will be delaminated from a die 26 in an integrated circuit die package 22 during an attachment of the die pad 28 to a heat sink member 30 (or members), a structure or structure design may be evaluated (using the above analysis or some other currently known or later developed analysis methodology) to determine whether a volume of last solidification 58 for solidifying solder 36 is being trapped at or near (proximate to) an interface 42 of the solder 36 and the die pad 28. If the last solidification volume 58 is at or near the interface 42 of the solder 36 and the die pad 28, the design of the structure 40 or some part of the structure 40 (e.g., redesigning a heat sink member 30) may be modified so that the last solidification volume 58 will be (always or most of the time) shifted farther away from the interface 42 of the solder and die pad and/or shifted farther away from being at concentrated central location. Based on the many factors that may contribute to delamination (discussed above), there are many ways or combinations of ways that a structure design may be modified to reduce the likelihood of delamination during solder solidification. Some of these ways of modifying the structure design will be described next. Any of the modification steps discussed below may be combined in any combination for a method of the present invention.

Upon evaluation of many sample structures, a trend was revealed that the solder thickness is an important factor regarding the cooling pattern of the solidifying solder 36. For a typical structure design (e.g., FIG. 2), structures 40 with a minimum solder thickness between the die pad 28 and the heat sink member 30 of greater than about 4 mils were more likely to have a trapped last solidification volume 58 of solidifying solder 36 at a central region and at or near the interface 42 of the solder 36 and die pad 28. When the solder 36 is thinner (e.g., less than about 4 mils), it tends to solidify more uniformly across the die pad 28 and is less likely to have a concentrated region of trapped solidifying solder 36. Therefore, one way to modify the structure design is to demand higher tolerances for the placement or formation of the heat sink member 30 in or on the PCB 34. It should be noted that the term "heat sink member" may be used herein to refer to one continuous piece or multiple distinct parts that act together as a heat sink.

Another way to modify the structure design is to make the die pad 28 thicker. However, the current trend is moving toward thinner die pads 28. Other ways of modifying the structure design include changing the material choices for the die mount compound 38 (e.g., stronger bond, higher melting temperature), the solder 36 (e.g., particulates included therein that do not melt at reflow temperatures, lower melting point solder), and/or die pad 28 (or leadframe), for example. Yet another solution (not shown) may be a layer added to the die pad 28 prior to the soldering to increase the strength of the die pad 28, for example.

Figure 9:
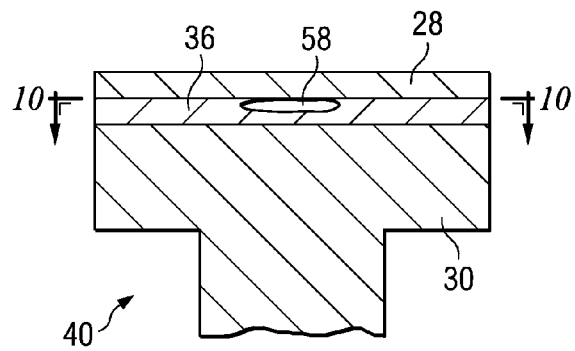
FIG. 9 is a simplified cross-section view of the structure of FIG. 2 illustrating a last solidification volume evidenced by one or more voids.
Figure 10:
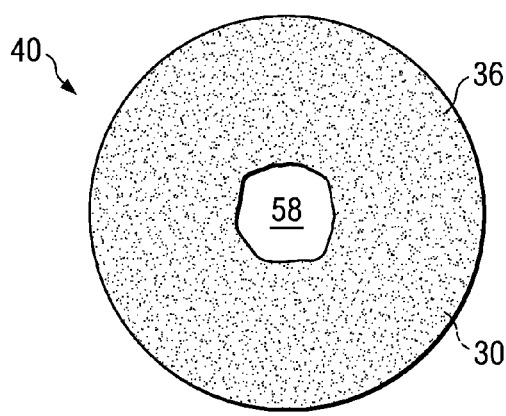
FIG. 10 is a top view of solidified solder on the rivet with the die pad removed.

A currently preferred way to modify the design structure in a method of the present invention is to modify the design of the heat sink member 30. Referring again to the structure design shown in FIG. 2, one of the problem-causing solder solidification patterns is illustrated in FIGS. 9 and 10, which are representative of the actual patterns observed in FIGS. 3A-4 (discussed above). FIG. 9 is a simplified cross-section view of the structure 40 of FIG. 2 illustrating a last solidification volume evidenced by one or more voids 58. Note that even if air pockets 58 are not formed at a last solidifying volume of solder 36, the negative pressure exerted on the die pad 28 by the solder 36 still may be great enough to cause delamination. FIG. 10 is a top view of the solidified solder 36 on the rivet 30 with the die pad 28 removed for illustration purposes (i.e., as viewed along line 10-10 of FIG. 9). FIG. 10 shows a top view of the last solidification volume region 58.

Figure 12:
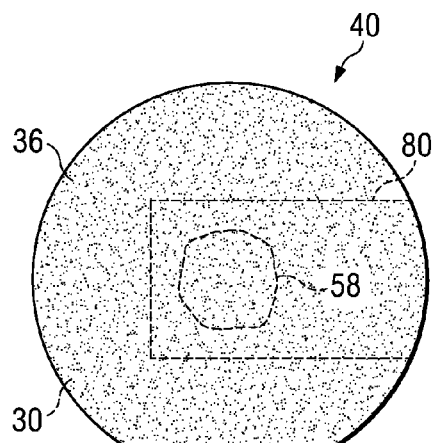
FIGS. 11-13 illustrate a modified heat sink rivet in a structure that shifts the last solidification volume farther away from the interface of the solder and the die pad.
Figure 13:
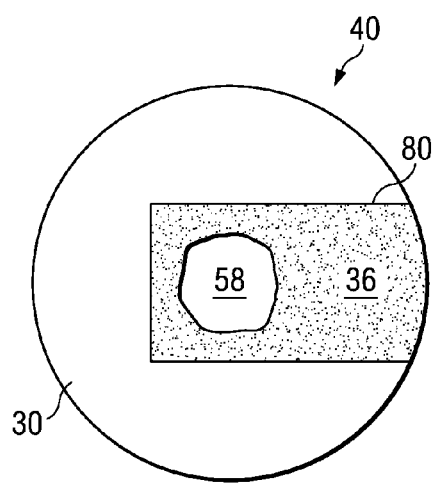
Figure 11:
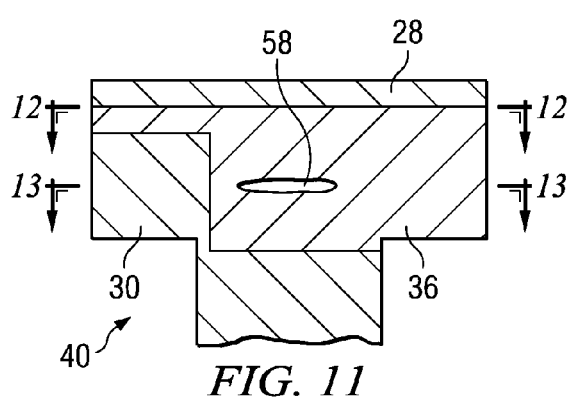

In a preferred method, the design of the heat sink member 30 is modified so that the last solidification volume is shifted farther away from the interface 42 of the solder 36 and the die pad 28 than before the modification. One illustrative way to do this for a heat sink rivet 30, for example, is to have a slot 80 formed in the rivet 30. Preferably, at least part of the slot 80 is centrally located (with respect to a die pad plane) in a top of the heat sink rivet 30. FIGS. 11-13 illustrate a modified heat sink rivet 30 in a structure 40 that shifts the last solidification volume 58 farther away from the interface 42 of the solder 36 and the die pad 28. FIG. 11 is a cross-section view through the center of the rivet 30 to illustrate the slot 80 formed in the rivet 30 and to illustrate the position of the last solidification volume 58 located at least partially in the slot 80. Note that the last solidification volume 58 in FIG. 11 is farther away from the interface 42 of the solder 36 and die pad 28 than in FIG. 9. FIG. 12 is a top view of the solidified solder 36 on the rivet 30 with the die pad 28 removed for illustration purposes (i.e., as viewed along line 12-12 of FIG. 11). FIG. 12 shows a top view of the last solidification volume region 58 buried in the solder 36 (in hidden lines) and a top view of the slot 80 (in hidden lines). FIG. 13 is a top cross-section view through the rivet 30 and through the last solidification volume 58 as taken along line 13-13 of FIG. 11. Using the modified heat sink rivet design shown in FIGS. 11-13, it is likely that during the solder solidification process, solder 36 will solidify along the interface 42 of the solder 36 and the die pad 28 prior to solidifying within the slot 80. When the solder 36 solidifies along the interface 42, it forms a bridge of solder 36 and effectively thickens and strengthens the die pad 28. Hence, even though a trapped last solidification volume 58 is formed in a central portion (relative to the die pad plane) of the structure 40, it is less likely to displace or bow the die pad 28 because it is farther from the interface 42 and because the bridge of solder 36 there above (on the interface 42) tends to strengthen or support the die pad 28.

Although the slot 80 in FIGS. 11-13 extends only partly across the top of the rivet 30, in other embodiments (not shown) the slot 80 may have different shapes and different lengths. Also, there may be numerous slots formed in the top of the rivet 30, which may or may not intersect with each other. It is preferred that the slot 80 is deep enough to allow the bridge of solder 36 to form (as discussed above). The actual depth and the length of the slot 80 for a particular structure may be determined with some experimentation or by simulation (e.g., computer modeling). Thus, this modification method focuses on moving the last solidification volume 58 vertically away from the interface 42 of the solder 36 and the die pad 28.

Another preferred way of modifying the heat sink member 30 may focus on moving the last solidification volume 58 away from the central portion (along the die pad plane), for example. One illustrative example of such modification method for another embodiment of the present invention will be described next with respect to FIGS. 14-20.

Figure 14:
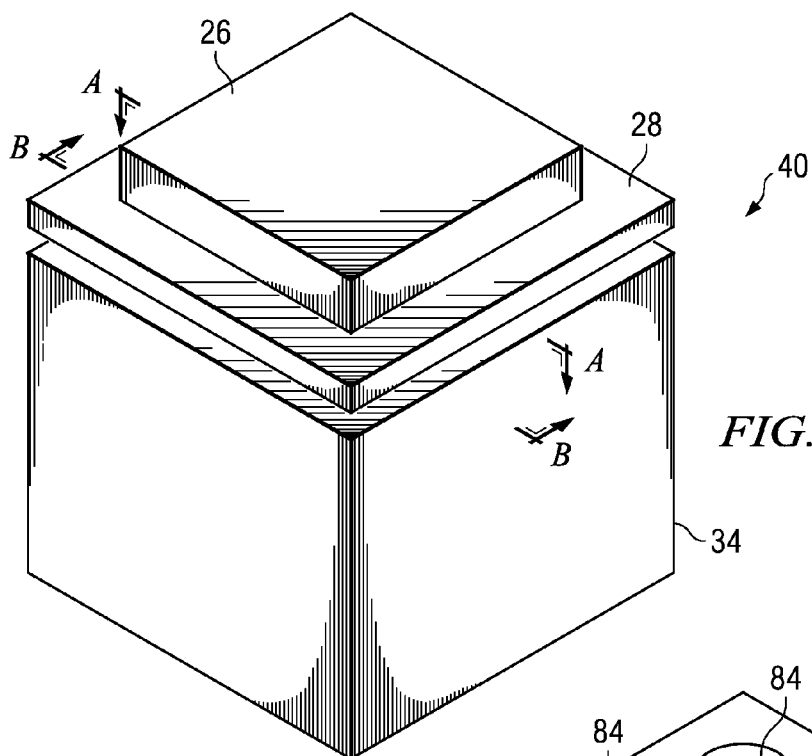
FIG. 14 is a perspective view showing a part of the structure cut-away from a printed circuit board.

FIG. 14 is a perspective view showing a part of structure 40 cut-away from a PCB 34 (which likely has other devices attached thereto). FIG. 14 is provided to provide a context reference for FIGS. 15-20. In FIG. 14, a die 26 is attached to a die pad 28, which is attached to a PCB 34 and a heat sink member 30 formed in the PCB 34. For purposes of simplification and illustration, the remainder of the die package 22 (e.g., leads, mold compound, wires, etc.) is not shown in FIG. 14.

Figure 15:
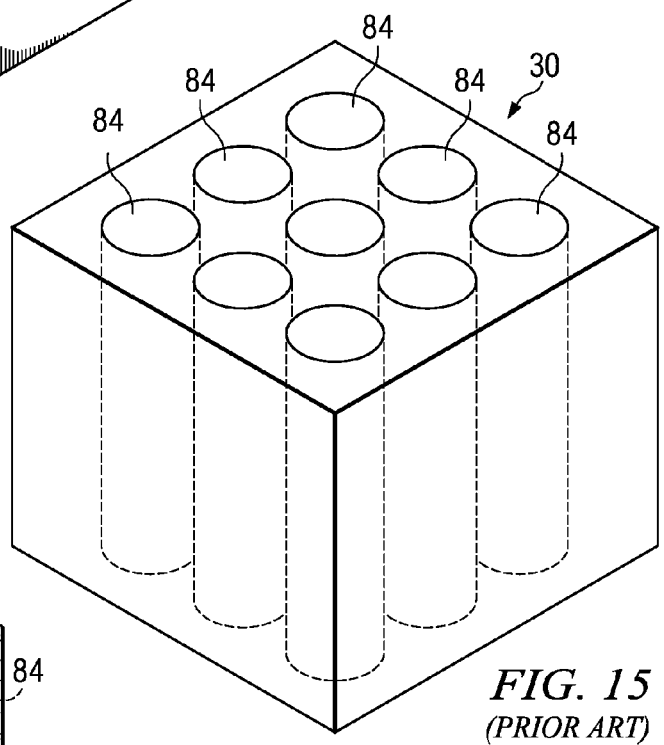
FIG. 15 is a perspective view of the printed circuit board with a heat sink member (nine metal vias) formed therein.
Figure 16:
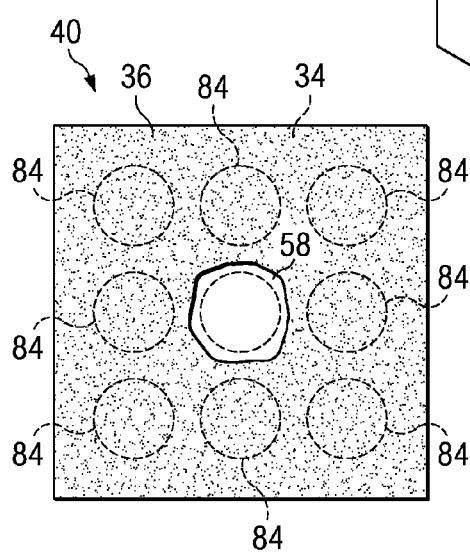
FIG. 16 is a top view of the solder on the heat sink members (design of FIG. 15) as taken along line A-A in FIG. 14.
Figure 17:
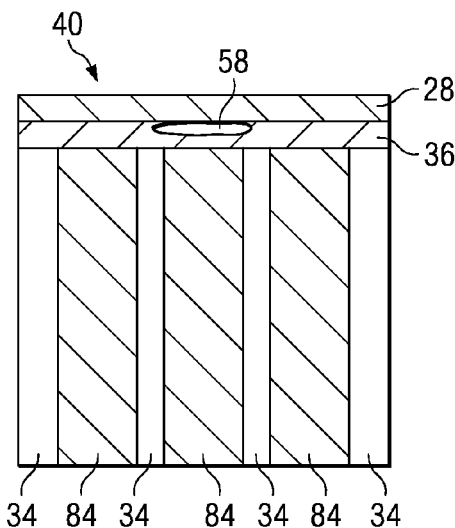
FIG. 17 is cross-section view of the structure of FIGS. 15 and 16 as taken along line B-B in FIG. 14.

FIG. 15 is a perspective view of the PCB 34 without the die package 22 and solder 36 to illustrate the arrangement of the heat sink member 30, which includes a set of nine metal vias 84 formed in the PCB 34. Note that one of the metal vias 84 of this design is centrally located with the remaining eight metal vias 84 surrounding it. It has been found that during the cooling of the solder 36 after a reflow process (while attaching the die pad 28 to the heat sink member 30 with solder 36 and while attaching the leads of the package 22 to the PCB 34), a trapped last solidification volume 58 for the solidifying solder 36 is centrally located. This is illustrated in FIGS. 16 and 17. FIG. 16 is a top view of the solder 36 on the heat sink member 30 (design of FIG. 15) and the PCB 34 as taken along line A-A in FIG. 14. FIG. 17 is cross-section view of the structure 40 of FIGS. 15 and 16 as taken along line B-B in FIG. 14. As shown in FIGS. 16 and 17, for the heat sink design of FIG. 15, the last solidification volume 58 is likely to be centrally located and at or near the interface 42 of the solder 36 and the die pad 28. As discussed above, this is not a preferred location for the last solidification volume 58 of the solidifying solder 36. During cooling, the centrally located metal via 84 tends to cool slower than the outer metal vias 84, which can cause the last solidification volume 58 to be above the centrally located via 84, as illustrated in FIGS. 16 and 17.

Figure 18:
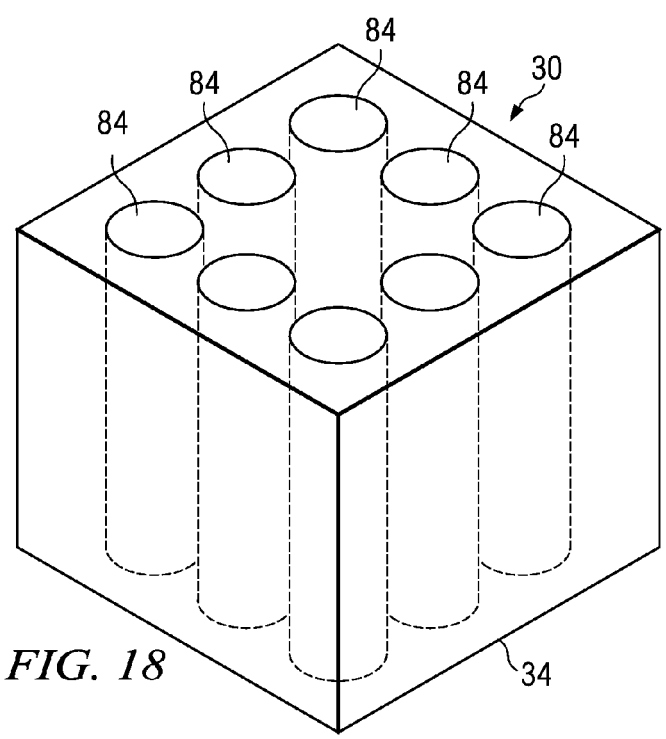
FIG. 18 is a perspective view of the printed circuit board with a modified heat sink member (eight metal vias) formed therein.
Figure 19:
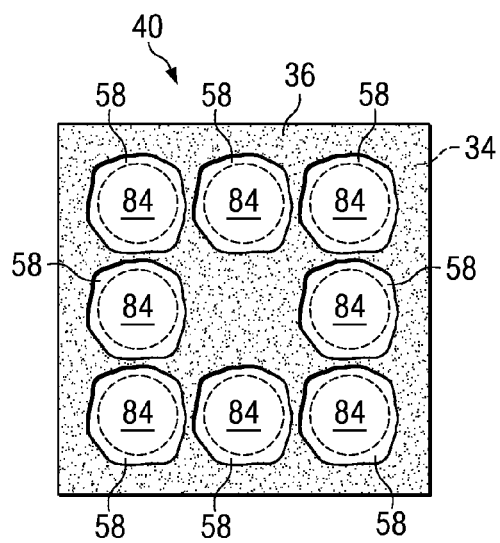
FIG. 19 is a top view of the solder on the heat sink members (design of FIG. 18) as taken along line A-A in FIG. 14.
Figure 20:
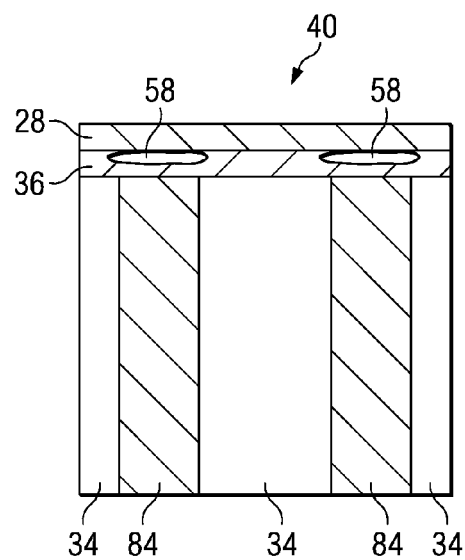
FIG. 20 is cross-section view of the structure of FIGS. 18 and 19 as taken along line B-B in FIG. 14.

In a method of the present invention, the design of the heat sink member 30 in FIG. 15 may be modified to shift the last solidification volume 58 away from a central location of the structure 40 along the die pad plane. One way to do this is illustrated in FIGS. 18-20. FIG. 18 is a perspective view of the PCB 34 with the metal vias 84 as the heat sink member 30, which is similar to that of FIG. 15. In the PCB 34 of FIG. 18, the heat sink design of FIG. 15 has been modified to remove the centrally located metal via 84. As a result, the solder 36 is more likely to solidify in the center during a reflow process before it solidifies over the metal vias 84. This is illustrated in FIGS. 19 and 20. FIG. 19 is a top view of the solder 36 on the heat sink member 30 (design of FIG. 18) and the PCB 34 as taken along line A-A in FIG. 14. FIG. 20 is cross-section view of the structure 40 of FIGS. 18 and 19 as taken along line B-B in FIG. 14. As shown in FIGS. 19 and 20, for the heat sink design of FIG. 18, the solder solidification is likely to occur at the central portion (with respect to the die pad 28) and on the outer edges. The last solidification volume(s) 58 are likely to be more evenly distributed over all the metal vias 84, as shown in FIG. 19, rather than being concentrated a one central location (see e.g., FIGS. 16 and 17). Even though there may still be trapped solidifying solder regions or volumes in the modified design of FIG. 18, as shown in FIGS. 19 and 20, these volumes are likely to be smaller and more evenly distributed towards the outer edges of the die pad 28. Hence, the stress concentration at any one position on the die pad 28 should be decreased and the effective arm of the bending moment is significantly reduced to reduce the likelihood of deflecting the die pad 28.

An advantage of modifying the heat sink member 30 is that the modification may make the thickness of the solder irrelevant or less relevant. In other words, some heat sink member designs (see e.g., examples described above) may work well with a wider range of solder thicknesses than prior designs.

With the benefit of this disclosure, one of ordinary skill in the art will likely realize many other particular ways to modify a particular heat sink design in accordance with a method of the present invention. There are many currently know heat sink designs for a structure and there will likely be many more future developed heat sink designs for extracting heat from a die pad of die package. In any case, a method of the present invention may be used to evaluate and, if needed, modify a design of the heat sink member(s) and/or the structure to reduce the likelihood that a die pad will be delaminated from a die in an integrated circuit die package during the attachment of the heat sink member(s) using solder (e.g., during a solder reflow process).

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method of reducing a likelihood that a die pad will be delaminated from a die in an integrated circuit die package for a structure design during an attachment of a heat sink member to the die pad using solder, the method comprising:

evaluating a sample structure of the structure design to determine whether a volume of last solidification for the solder is at or near an interface of the solder and the die pad and is centrally located with respect to the die pad; and if the last solidification volume is at or near the interface of the solder and the die pad, modifying the structure design so that the last solidification volume is located farther from the interface of the solder and the die pad than before the modifying and/or is located farther from a central location of the die pad in a direction along a plane of the die pad than before the modifying.

2. The method of claim 1, wherein the heat sink member is a metal rivet attached to a printed circuit board.

3. The method of claim 1, wherein a minimum thickness of the solder is greater than about 4 mils between the die pad and the heat sink member for the sample structure evaluated.

4. The method of claim 1, wherein a minimum thickness of the solder is greater than about 5.5 mils between the die pad and the heat sink member for the sample structure evaluated.

5. The method of claim 1, wherein a minimum thickness of the solder is greater than about 7 mils between the die pad and the heat sink member for the sample structure evaluated.

6. The method of claim 1, wherein the modifying of the structure design comprises requiring the heat sink member or the die pad to have a slot formed therein, wherein at least part of the slot is at a central location, and wherein the top of the heat sink member is closer to the die pad than a remainder of the heat sink member when the heat sink member is attached to the die pad.

7. The method of claim 1, wherein the heat sink member comprises a plurality of metal vias formed in a printed circuit board, and wherein the modifying of the structure design comprises removing one or more centrally located metal vias of the plurality of metal vias from the structure design.

* * * * *